United States Patent [19]

Davis, III et al.

[11] Patent Number: 5,045,851

[45] Date of Patent: Sep. 3, 1991

[54] ANALOG SIGNAL MULTIPLEXER WITH NOISE REJECTION

[75] Inventors: Frederick B. Davis, III, Drexel Hill; Stephen P. Glaudel, Harleysville, both of Pa.; Sanjay Jhunjhunwala, Patna, India

[73] Assignee: General Signal Corporation, Stamford, Conn.

[21] Appl. No.: 288,323

[22] Filed: Dec. 21, 1988

[51] Int. Cl.⁵ .............................................. G08C 15/06
[52] U.S. Cl. ............................ 340/870.13; 340/870.17; 340/870.21
[58] Field of Search ................... 374/166, 167, 870.17, 374/870.21; 340/870.13; 307/109; 370/100, 112, 113

[56] References Cited

U.S. PATENT DOCUMENTS

| | | | |
|---|---|---|---|
| 3,271,651 | 9/1966 | Diederich | 340/870.13 |
| 3,281,808 | 10/1966 | Church et al. | 340/870.13 |
| 3,764,983 | 10/1973 | Stok | 340/870.13 |
| 3,913,488 | 3/1976 | Kazahaya | 340/870.13 X |
| 4,188,617 | 2/1980 | Fauchies et al. | 340/870.13 X |
| 4,307,335 | 12/1981 | Paulson | 324/537 |
| 4,380,764 | 4/1983 | Connors | 370/113 X |
| 4,496,250 | 1/1985 | Walsh | 340/870.17 X |

Primary Examiner—Donald J. Yusko
Assistant Examiner—Michael Horabik
Attorney, Agent, or Firm—William G. Miller, Jr.; Harold Huberfeld

[57] ABSTRACT

In analog multiplexers using solid state multiplexing relays and having a shunt capacitor circuit across each input channel as part of a filter for normal mode noise, common mode noise is rejected by opening the shunt capacitor circuit in at least the selected channel and preferably all channels during the switching cycle of each channel for a full cycle of the a.c. line frequency, the opening spanning the deselection time for the selected channel and the selection time for the next channel.

4 Claims, 1 Drawing Sheet

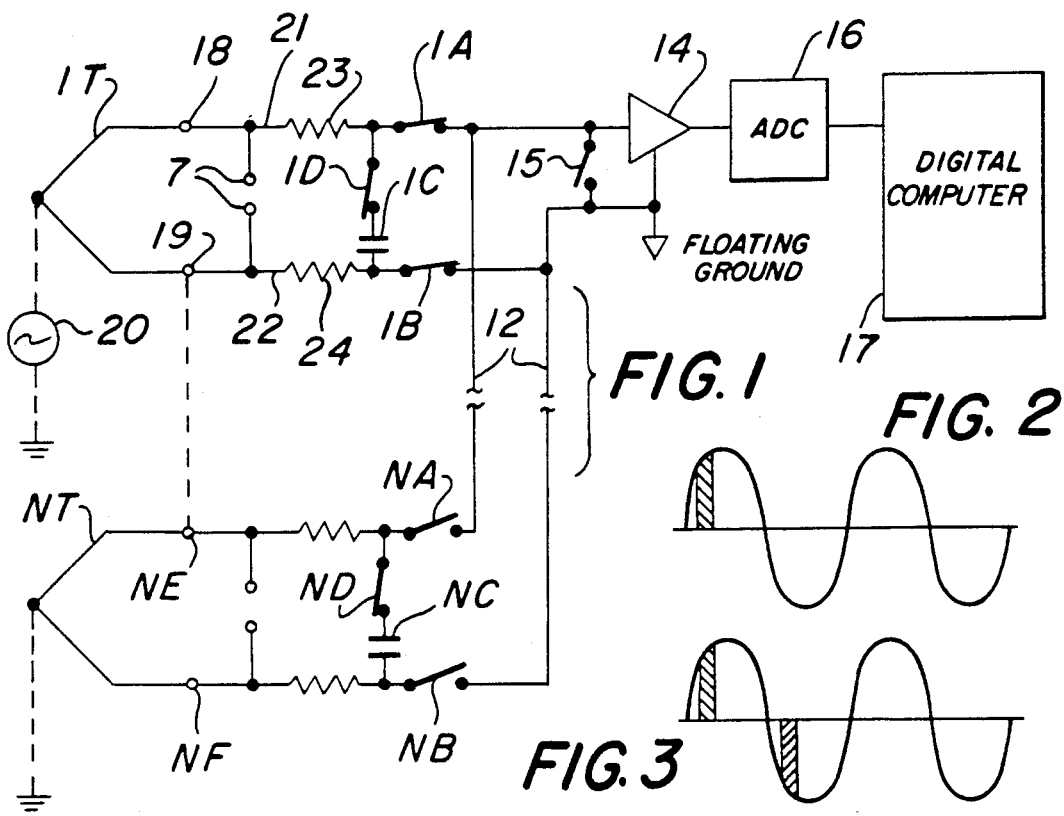
FIG. 1
FIG. 2
FIG. 3
FIG. 4
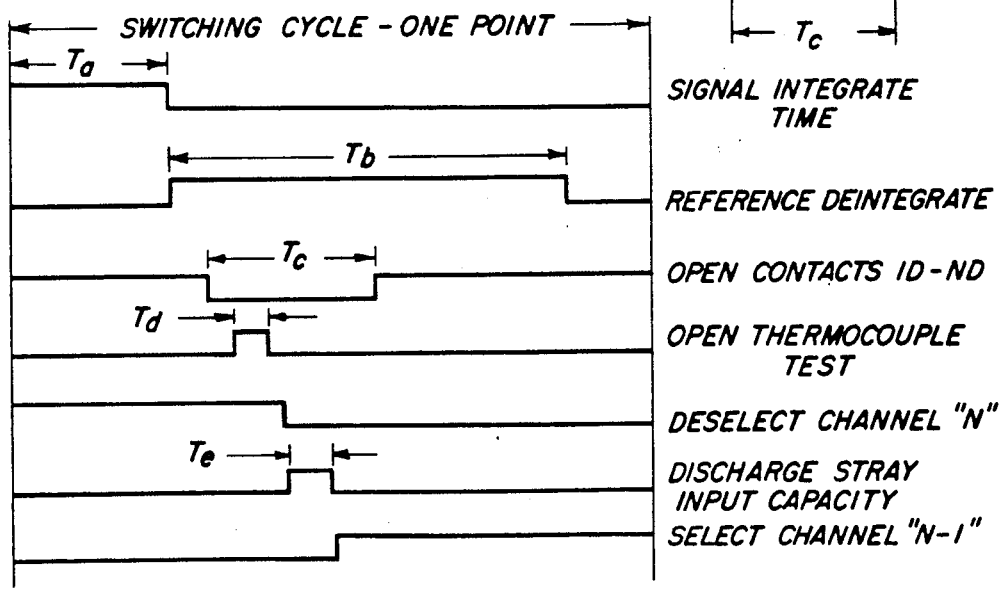
FIG. 5

ANALOG SIGNAL MULTIPLEXER WITH NOISE REJECTION

BACKGROUND OF THE INVENTION

In multiplexers for analog data acquistion systems, a plurality of inputs, such as thermocouples, are scanned by selectively connecting their input lines to a signal bus. The connection is made through a filter having resistors in the input lines and a shunt capacitor for removing normal mode noise. A signal bus connects the selected input through an amplifier to an analog-to-digital converter, and the digitized result is made available for further processing. Relay contacts in the input lines provide the connection of the selected input to the bus. In the past the relays have usually been of the electromechanical type. With such relays common mode noise pickup on the inputs has not presented a problem because of the high resistance between the contacts of electromechanical relays when they are in the open state. Also, the capacity between the open contacts is typically high.

It has become important for a number of reasons to use solid state relays in place of the electromechanical units for this type of service. These switches exhibit poor performance under transient common mode voltages due to self-commutation. In other words, the devices will appear to have a low open circuit impedance in the presence of common mode transients. Also, a higher capacity between the open contacts is experienced. Those conditions lead to a degradation of the common mode noise rejection due to the tendency for common mode noise to charge the capacity in the input circuits as a result of leakage through the open contacts of the solid state relays.

It is an object of this invention to provide a method and apparatus for rejecting both common mode and normal mode noise in analog signal multiplexing circuits which use solid state relays or any other type of relay which exhibits a high coupling capacity and insufficiently high open circuit impedance to transients.

SUMMARY OF THE INVENTION

In analog multiplexing circuits having a shunt capacitor across each pair of input lines to reject normal mode noise, common mode noise of the a.c. line frequency is rejected by opening for a full cycle of the a.c. line frequency the shunt capacitor in at least the input lines to be selected next.

BRIEF DESCRIPTION OF THE DRAWINGS

In the drawings:

FIG. 1 is a diagram of a multiplexing circuit which is useful in the invention..

FIG. 2 is a waveform illustrating an unsuccessful approach to rejecting common mode noise in multiplexers using solid state relays without at the same time reducing the normal mode rejection.

FIG. 3 is waveform illustrating still another unsuccessful approach.

FIG. 4 is a waveform illustrating a successful approach using the invention.

FIG. 5 shows the preferred timing of the relay contacts of FIG. 1.

DESCRIPTION OF THE PREFERRED EMBODIMENTS

FIG. 1 shows an N-channel multiplexer for an analog data acquisition system which scans input signals from N primary elements, such as thermocouples 1T-NT. The input circuits for each channel are constructed similarly and have similar parameters. As shown for channel #1, the thermocouple is connected to the input terminals for that channel, terminals 18 and 19. Those terminals are, in turn, connected by way of input lines 21 and 22 through a filter circuit for normal mode noise, made up of the series resistors 23 and 24 in combination with a shunt circuit including the series combination of a normally closed switch 1D and capacitor 1C. The input lines are connected to a signal bus 12 by the multiplexer contacts, such as 1A and 1B. Thus, if channel #1 is selected, contacts 1A and 1B will be closed, as shown in FIG. 1. Under that condition the output of thermocouple 1T will be supplied as the input to a floating single ended amplifier 14, assuming shorting contact 15 is normally open. The amplifier supplies its output to a measuring circuit in the form of an analog-to-digital converter (ADC) 16, which is also floating and is typically a dual slope type of converter which integrates the input signal for a fixed period and then deintegrates for whatever period is necessary to reduce the integrated value to zero so that the deintegration time is indicative of the value of the input. The converter output is, in turn, supplied to a computer 17 for further processing.

It has been the practice in multiplexer circuits of the type shown to perform an open circuit test on each thermocouple while it is selected to be sure that the signal being converted is a valid signal. A typical open circuit test includes the sending of a pulse through the thermocouple as by a test circuit connected to the input circuit at terminals 7. A useful circuit for such a test is described in U.S. Pat. No. 4,496,250, issued to a coworker of ours on Jan. 29, 1985. That patent is hereby incorporated by reference as part of this specification.

It has been the practice to open the shunting capacitor circuit of the selected channel, such as by switch 1D for channel #1, for a short period when the open circuit test is being made. The open circuit test is made at the conclusion of the conversion on the selected channel so that the effects of the pulse used in the test will die out before the channel is selected again.

When a channel, such as channel #1 is selected, the common mode voltage, shown in phantom as source 20, is switched to the bus and the stray capacitance of the circuit is charged causing charging currents to flow in the different branches of the circuit. Unfortunately, when the multiplexing relay contact are of the solid state type, they will conduct slightly when the common mode voltage transient hits the signal bus and will thereby cause relatively high currents to flow through the supposedly open contacts of the unselected channels, such as through contacts NA and NB. A percentage of those currents will flow into capacitors 1C-NC changing the terminal voltages on those channels if the contacts 1D and ND are closed. Such current flows will, of course, cause the common mode rejection ratio to degrade beyond acceptable limits.

One approach to a solution of this problem would seem to be to open the relay contacts 1D-ND slightly before contacts 1A and 1B close and then close them after the transient currents cease flowing. The relay open time might typically be 1 ms. This approach, however, has been found to destroy the normal mode rejection by causing partial rectification of the normal mode interference. FIG. 2 shows the current through the filter capacitor for a.c. line induced normal mode interference. The shaded area shown is the open time provided for contacts 1D-ND. The effect of that period of open time is to cause the area under the current envelope for the two polarities to be unequal, thus leaving a d.c. component which would not be rejected by the dual slope integration of the ADC, as would otherwise be the case without the open time.

Another possible solution which seemed plausible involved opening the shunting capacitor circuits for a short period, as shown in FIG. 2, and then opening those circuits again for a similar short period exactly one half cycle after the first opening. This possibility is shown in FIG. 3. It was found, however, to be only partially successful since the effect of the first opening decayed slightly at the time of the second opening causing over-compensation for the defect caused by the first opening. In addition, the correction provided was further degraded for even order harmonics in the interfering signal.

We discovered that a complete solution to this problem is provided by the opening at least one of the shunting contacts 1D-ND for exactly one full cycle or an integral number of full cycles of the a.c. line frequency, as shown in FIG. 4. The contact to be opened must be that associated with the channel to be selected next. This approach does not leave any residual charge on the capacitor and is completely insensitive to even or odd harmonics. While switching only the shunting contacts in the channel to be selected next is useful, switching the contacts in all of the channels is better, both from the standpoint of simplifying the switching problem as well as for improving the noise rejection. This simultaneous switching of all the shunting contacts enhances the noise rejection because any transients that appear on the signal bus would not be able to couple to the capacitors of the other channels through the open contact capacity of the unselected relay contacts.

Instead of inserting an additional dead time of one line cycle (16.67 ms for 60 Hz line frequency) in the switching period of each channel the reference deintegration time of the current channel itself may be utilized to accommodate the dead time required and also allow the switching to the next channel while the shunting circuits are open. This approach allows ample stabilization time for the next channel to be converted should there be any non-line frequency noises present. Also, during the period in which all of the normal mode filters are disconnected by disconnection of contacts 1D-ND (one line cycle) the open thermocouple detection test can be performed on the current channel before switching to the next one. This leaves the charge on the capacitor uncorrupted and eliminates any further need to open the normal mode filter before the next cycle.

FIG. 5 shows a preferred timing of the various relay contacts shown in FIG. 1. This timing is established by the microprocessor in computer 17. The cycle illustrated is for a single channel selection period. It begins with the signal integrate time, Ta, which is when the ADC is acquiring the input signal selected. After period Ta ends the reference deintegrate time, Tb, begins. After Tb has begun the channel need no longer be connected to the signal bus, for the value of the input on that channel has already been acquired, and any changes in the input circuit will not affect the conversion process of the ADC. Because of this fact, the opening of the contacts 1D-ND for a full cycle of the a.c. line frequency can safely occur after the end of Ta and will terminate before the end of Tb. During the period Tc, the open thermocouple test can be made for the period Td. That test should be followed by a deselection of the presently selected channel "N" and a discharge of the stray input capacity by the shorting of relay contacts 15 before Tc ends. The next step, which also should occur before the end of Tc, is the selection of the next channel, "N+1". It will thus be seen that the time period for opening the shunt circuits will span or bracket the deselection of the presently selected channel and the selection of the next channel while avoiding coexistence with the input signal acquisition period Ta.

Typical values for the components of the circuit of FIG. 1 are: 1000 ohms for resistors 23 and 24, 22 microfarads for capacitors 1C-NC, and a typical multiplexing relay to provide contacts 1A,1B-NA,NB would be International Rectifier BOSFET photovoltaic relays of the type PVA3354.

What is claimed is:

1. A method for rejecting common mode noise in a multiplexed analog data acquisition system which utilizes a plurality of thermocouple pairs for making temperature measurements, a normal mode filter across each of said pairs which includes a capacitor and a switch in series connection across each of said pairs, input lines for each of said pairs for connecting the parallel combinations of said pairs and their associated filter capacitors across a measuring circuit, and relay contacts in each of the input lines for selectively connecting said thermocouple pairs to the measuring circuit one at a time during periods of signal acquistion, comprising the step of opening during the switching cycle for each channel the switchable shunt capacitor circuit for at least the channel to be selected next, said opening being for a period which is an integral number of full cycles of the a.c. line frequency and is timed to span the deselection of the presently selected channel and the selection of the next channel as well as the period during which transient current flows due to said selection while at the same time avoiding overlap with the input signal acquisition period.

2. A method for rejecting common mode noise in a multiplexed analog data acquisition system which utilizes a plurality of thermocouple pairs for making temperature measurements, a normal mode filter across each of said pairs which includes a switchable shunt capacitor circuit across each of said pairs for rejecting normal mode noise, input lines for connecting each of said pairs and their associated shunt capacitors across a measuring circuit, and relay contacts in each of the input lines for selectively connecting and disconnecting selected thermocouple pairs to the measuring circuit one at a time, comprising the step of opening the switchable shunt capacitor circuits for all channels for a period of at least a single full cycle of the a.c. line frequency during the switching cycle for each channel, said period being timed to span the deselection of the presently selected channel and the selection of the next channel as well as the period during which transient current flows due to said selection while avoiding overlap with the period when the measuring circuit is acquiring the selected channel.

3. A method for rejecting common mode noise in a multiplexed analog data acquisition system which utilizes a floating analog-to-digital converter of the dual slope type having a signal integrate time followed by a reference deintegrate time which converts d.c. input signals acquired for the selected input during the signal integrate time into digital signals available for further processing at the end of the reference deintegrate time, a switchable shunt capacitor circuit across each pair of input lines associated with a thermocouple to be measured as part of a normal mode noise filter network for that thermocouple, means for testing for an open circuit condition of the selected thermocouple by passing a pulse through the selected thermocouple at a selected time, and relay contacts in each of the input lines for selectively connecting the associated thermocouple and its switchable shunt capacitor to the analog-to-digital converter through a signal bus, and where a relay contact can be selectively closed to shunt said bus, comprising the steps of opening the switchable shunt capacitor circuits for all channels for at least a single full cycle of the a.c. line frequency during the reference deintegrate time for each selected channel, and during said opening making the open circuit test of the selected thermocouple, deselecting the selected channel after said open circuit test of the selected channel, closing for a short period said bus shunting relay contacts in order to discharge the stray input capacity after said deselection, and selecting the next channel after said short period and sufficiently before the end of said full cycle to allow transient currents due to said selection to cease flowing before the end of said full cycle.

4. A multiplexed analog data acquisition system which is programmed to sequentially select each of a plurality of thermocouples and to measure their output by first acquiring the output of the selected thermocouple and then determining the magnitude of that output, comprising:

a filter circuit in parallel with each of said thermocouples, each filter circuit including at least the series combination of a capacitor and a switch whose open time, during that part of the sequence when the switch is associated with the thermocouple to be selected next, is of duration corresponding to at least a single full cycle of the a.c. line frequency with the timing of said open time being such that it spans the deselection of the presently selected thermocouple and the selection of the next thermocouple, as well as the period during which transient current flows due to said selection, while at the same time avoiding overlap with the time during which the measuring circuit is acquiring the output of the selected thermocouple; and relays for making sequential connections of the parallel combinations across a measuring circuit so that the output of the thermocouples may be acquired.

* * * * *